United States Patent [19]

Springer et al.

[11] 3,992,654

[45] Nov. 16, 1976

[54] DISCONNECT ARM FOR ELECTRICAL EQUIPMENT

[75] Inventors: William B. Springer, Euclid; Theodore J. Markley, Mentor; James F. Burns, Chagrin Falls; Donald E. Taylor, Richmond Heights, all of Ohio

[73] Assignee: Allen-Bradley Company, Milwaukee, Wis.

[22] Filed: Mar. 26, 1975

[21] Appl. No.: 562,247

[52] U.S. Cl. .............................. 317/101 DH; 339/4
[51] Int. Cl.² ............................................ H02B 1/02
[58] Field of Search ............... 317/101 DH, 101 CB, 317/122; 339/4, 34, 44 M; 179/98

[56] References Cited

UNITED STATES PATENTS

| | | | |
|---|---|---|---|
| 2,927,295 | 3/1960 | Sitz | 339/18 B |
| 3,356,905 | 12/1967 | Linn | 339/4 |

FOREIGN PATENTS OR APPLICATIONS

| | | | |
|---|---|---|---|
| 241,580 | 11/1963 | Australia | 339/4 |
| 1,471,254 | 1/1967 | France | 317/101 DH |
| 1,126,450 | 3/1962 | Germany | 199/98 |

*Primary Examiner*—David Smith, Jr.
*Attorney, Agent, or Firm*—Quarles & Brady

[57] ABSTRACT

A set of circuit boards are mounted side by side and electrical connection is made to terminal pads disposed along one edge of each circuit board by connectors which are carried by swing arms. The swing arms rotatably mount to a wire duct and each pivots between a horizontal position and an upright operating position in which connection is made to the terminal pads on its associated circuit board. Wire terminals on the connector in each swing arm provide termination for wires in the wire duct.

15 Claims, 6 Drawing Figures

Fig. 3
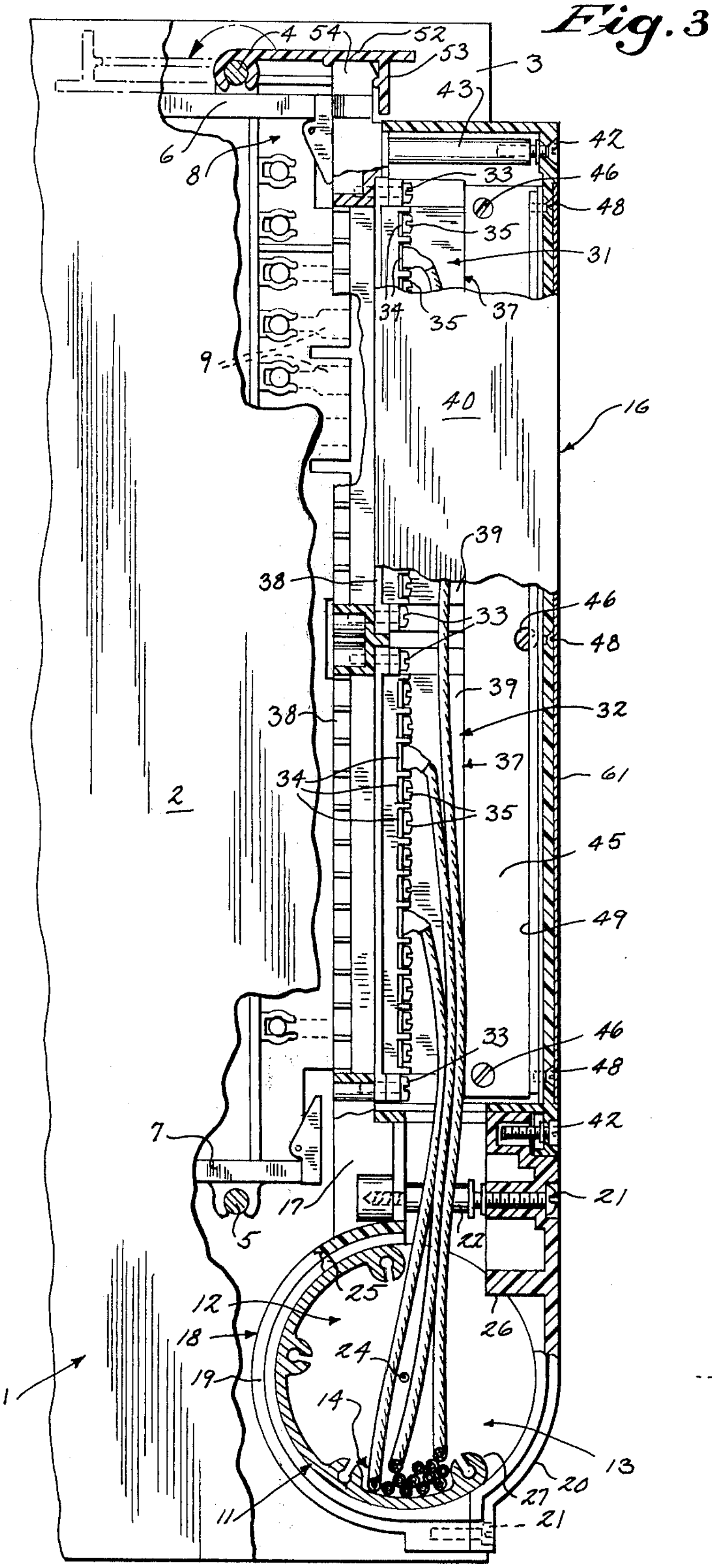
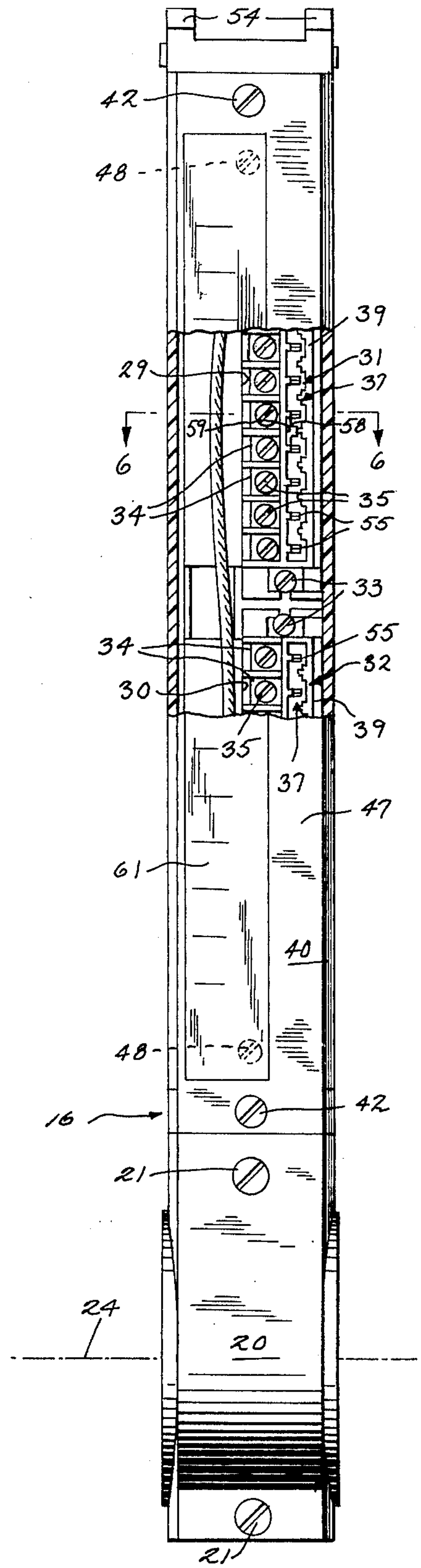
Fig. 4

DISCONNECT ARM FOR ELECTRICAL EQUIPMENT

BACKGROUND OF THE INVENTION

The field of the invention is electrical connectors, and more specifically, connectors for fastening wires to terminals which are disposed along one edge of a printed circuit board.

In electrical apparatus such as solid state controllers, numerical control directors, programmable controllers, digital computers, and communication equipment, the circuit components are mounted on one or more printed circuit boards which are closely spaced to one another and are interconnected by a wire harness, or a "mother board". In programmable controllers, for example, the circuit boards are also connected to external devices such as switches, motors, relays and solenoids. The connection of such devices to the electrical equipment is made by the user and it may involve the connection of hundreds or even thousands of wires to a large number of printed circuit boards.

There are numerous commercially available connectors which provide suitable termination for a bundle of wires and which fasten to a printed circuit board. The wires are attached to the connector by the user and the connector is then plugged onto one edge of a printed circuit board where it makes electrical connection with a set of circuit board terminals. When the circuit board is to be inspected or removed, the connector is unplugged and its attached wire harness is folded back to provide access to the board.

When prior connectors are used and a malfunction occurs in one circuit board, it is usually necessary to shut down the entire apparatus. In the input/output rack of a programmable controller, for example, each input and output circuit contains a fuse which protects the circuitry from short circuits applied at the terminals. It is not an uncommon event for one of the fuses to open circuit, and a means for disconnecting power from the affected circuit board and providing quick access to the fuses thereon without powering down the entire system is highly desirable.

SUMMARY OF THE INVENTION

The present invention resides in an improved electrical connector in which the connector block is mounted on an arm which is swung away from the terminals to which the connector block is fastened to expose the terminals and associated circuitry for inspection and repair. More specifically, the invention resides in an electrical connector for removably fastening a plurality of wires to a set of terminals which are supported by a frame and which comprises a wire duct mounted to the frame and disposed along the pivot axis, a swing arm rotatably fastened to pivot about one of its ends and about the pivot axis between an operating position and a maintenance position, and a connector block mounted on the swing arm and positioned to engage and make electrical connection with the set of terminals when the swing arm is swung to its operating position. The connector block includes terminals suitable for terminating wires.

A general object of the invention is to facilitate the disconnection of wires from a set of terminals. The swing arm provides support for the connector block and attached wires, and by grasping the swing arm and pivoting it to the maintenance position the connector block is unplugged from the set of terminals and carried to a non-obstructing position. By enclosing the connector block and attached wires with a suitable insulating cover, the disconnection can be made without powering down the equipment.

Another general object of the invention is to provide improved means for connecting wires to the terminals on circuit boards which are closely stacked one alongside the other. The edges of the circuit boards are aligned to define a back plane and the wire duct runs beneath each circuit board with the pivot axis substantially parallel to the back plane. The wire duct provides a wire channel which encloses and guides the wires to be connected to the circuit boards and it provides support for a plurality of swing arms which are rotatably mounted thereto and disposed side by side along the pivot axis. Each swing arm provides termination for the wires to be connected to one circuit board and each swing arm pivots in a plane which intersects with the back edge of its associated circuit board to make connection therewith when it is swung to its operating position.

A more specific object of the invention is to facilitate disconnection and exposure of each circuit board and attached electrical components for inspection, repair and replacement. Each swing arm pivots about the wire duct from a substantially upright position in which it connects to and covers the back edge of its associated circuit board to a substantially horizontal position in which the circuit board is exposed. If necessary, the circuit board can then be easily withdrawn from the supporting frame, or exposed components such as fuses can be tested and replaced if necessary.

Another object of the invention is to enclose the wires which connect to rack mounted circuit boards. The connector block is enclosed by a cover which fastens to the swing arm and the wire duct defines a wire channel which encloses wires fed into the wire duct from either of its ends. The wires run along the channel until they reach the plane of the swing arm to which they attach, and at this point they are fed out of the wire duct and along the length of the swing arm beneath the protective cover. During connection of the wires to the connector blocks, the covers on the swing arms are removed to provide access to the channel in the wire duct and to the connector block terminals.

Still another specific object of the invention is to provide status indicator lights which are readily visible. The lights are mounted on the cover of each swing arm and each is plugged into the connector block when the cover is fastened in place.

Still another specific object of the invention is to provide an interlock which prevents insertion of the wrong circuit board. The connector block on each swing arm is uniquely keyed to prevent the swing arm from being swung completely to its operating position if the incorrect circuit board is inserted into the rack. As a result, power will not be applied to the circuit board and the error will become readily apparent to the user before any damage is done.

The foregoing and other objects and advantages of the invention will appear from the following description. In the description reference is made to the accompanying drawings which form a part hereof, and in which there is shown by way of illustration of preferred embodiment of the invention. Such embodiment does not necessarily represent the full scope of the invention, however, and reference is made therefore to the claims herein for interpreting the scope of the invention.

Brief Description of the Drawings

FIG. 3 is a partial side view of the rack of FIG. 1 with parts cut away, FIG. 4 is an elevation view with parts cut away of a swing arm which forms part of the invention.

DESCRIPTION OF THE PREFERRED EMBODIMENT

Figure 1:
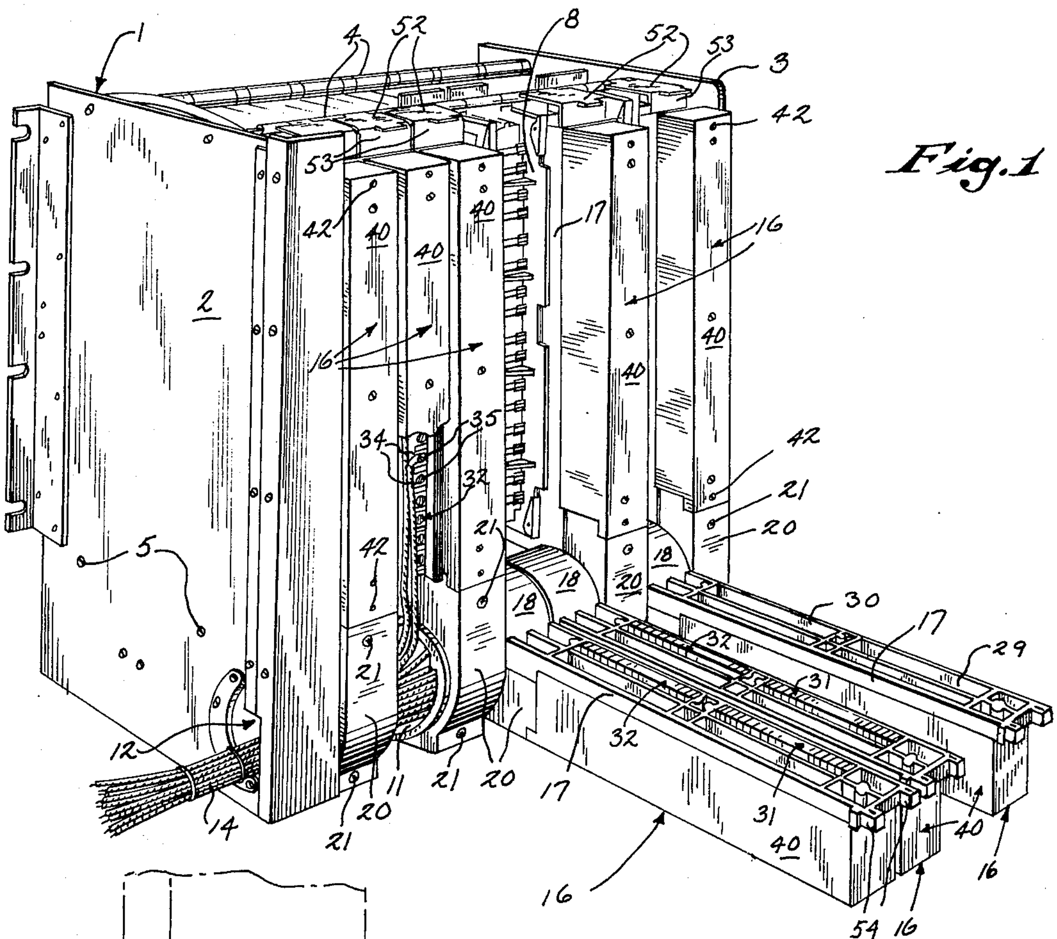
FIG. 1 is a perspective view of a programmable controller input/output rack which incorporates the connector of the present invention.

Referring particularly to FIGS. 1 and 3, the invention is shown embodied in the input/output interface rack of a programmable controller such as that disclosed in copending U.S. patent application Ser. No. 473,149 entitled "Programmable Logic Controller". The interface rack includes a frame comprised of a pair of upright side walls 2 and 3 which are fastened to one another by a pair of upper support rods 4 and a pair of lower support rods 5. The support rods 4 and 5 are parallel to one another and a set of upper guide rails 6 and a set of lower guide rails 7 connect between the upper support rods 4 and lower support rods 5 respectively. Each of the upper guide rails 6 is paired with one of the lower guide rails 7 and each includes a slot (not shown in the drawings) which slidably receives and holds a circuit board 8. A set of eight circuit boards 8 are thus retained between the side walls 2 and 3 in closely spaced, substantially vertical planes. The circuit boards 8 are each rectangular in shape having upper and lower edges which are received in the slotted guide rails 6 and 7, having a forward edge which is received in a connector that mounts to a mother board (not shown in the drawings) that extends across the front of the frame 1, and having a back edge aligned with the back edges of the other circuit boards 8 to define a back plane. A set of terminal pads 9 are formed on each circuit board 8 and are disposed along its back edge.

Figure 2:
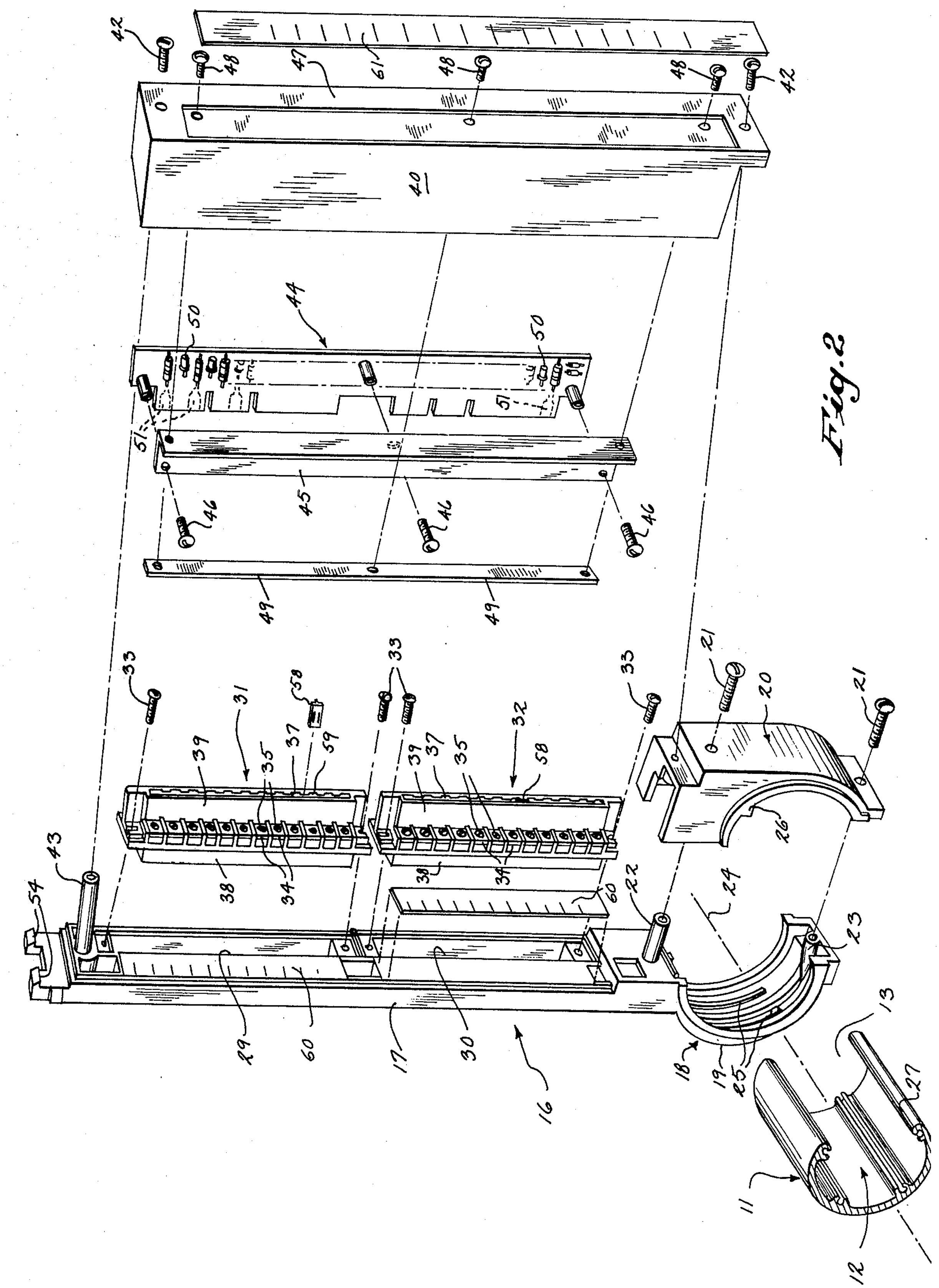
FIG. 2 is an exploded perspective view of the invented connector which forms a part of the rack of FIG. 1.

Referring particularly to FIGS. 1–3, a wire duct 11 extends across the back of the frame 1 substantially parallel to the back plane and rigidly fastened to the side walls 2 and 3 beneath the circuit boards 8. The wire duct 11 is formed of extruded aluminum and has a substantially circular cylindrical shape which defines a wire channel 12 that runs its entire length and communicates through openings in each side wall 2 and 3. An opening, or mouth 13 is formed along the length of the wire duct 11 and it faces substantially rearward and upward. As will be described in more detail hereinafter, wires 14 which are to be connected to the terminal pads 9 on the circuit boards 8 extend through the openings at the ends of the wire duct 11, run along the wire channel 12 to the plane of the circuit board 8 to which they connect. They make a right angle bend out of the wire channel 12 at this point and exit through the mouth 13.

In addition to defining the wire channel 12 which quides and protects the wires 14, the wire duct 11 also serves to pivotally mount a set of eight swing arms 16 which are disposed side by side across the back of the frame 1. Referring particularly to FIG. 2, each swing arm 16 includes an elongated base portion 17 which is pivotally fastened to the wire duct by a sleeve portion 18 and which extends radially outward therefrom a substantial distance. The base 17 and an arcuate portion 19 of the sleeve 18 are molded as a single unit from an electrically insulating, thermosetting plastic material. A separately molded plastic cap 20 is fastened to the arcuate portion 19 by a pair of screws 21 which are received in threaded openings formed in a lower post 22 and a rib 23. The arcuate portion 19 and cap 20 form the sleeve 18 which surrounds the wire duct 11 and pivotally mounts the base 17 thereto for rotation in a vertical swing plane about a pivot axis 24 that extends along the wire duct 11 at its center. Each swing arm 16 is associated with one of the circuit boards 8 and is, therefore, in substantial vertical alignment therewith.

Figure 5:
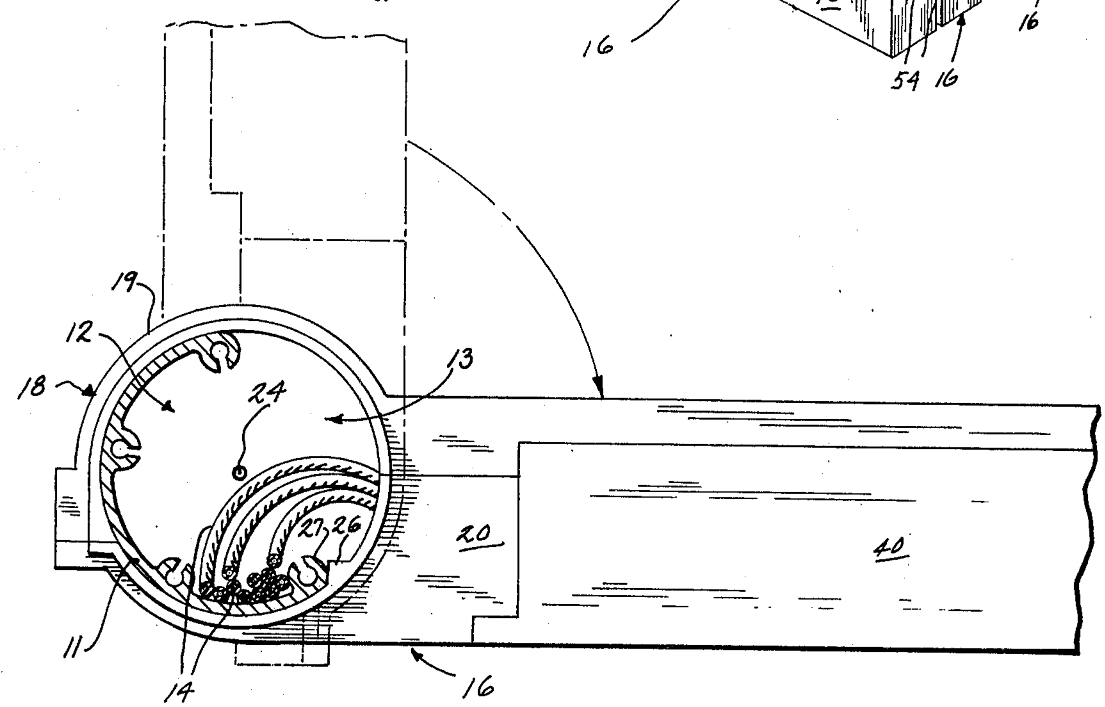
FIG. 5 is a partial schematic view of the swing arm of FIG. 4.

A set of ribs 25 are formed in the interior surface of the sleeve 18 and are slightly eccentric to snugly engage the outer surface of the wire duct 11 when the base 17 is in an upright, or operating position. As shown best in FIG. 5, a stop member 26 is also formed on the inner surface of the sleeve 18, and it extends radially inward therefrom to engage a lip 27 on the wire duct 11 when the swing arm is lowered to a substantially horizontal, maintenance position. When pivoted upward from its maintenance position, each swing arm 16 engages its associated circuit board 8, and as will be described in more detail hereinafter, makes electrical connection with the terminal pads 9 thereon when the swing arm reaches its fully upright, operating position. Each swing arm 16 thus pivots in a vertical swing plane about the pivot axis 24. This swing plane is substantially perpendicular to the back plane and it intersects with the terminals 9 on an associated circuit board 8.

Referring particularly to FIGS. 3 and 4, each swing arm 16 is locked in its operating position by a latch member 52 which is pivotally fastened to the upper rear support rod 4. The latch member 52 includes an integrally formed hook 53 which engages and snaps into place over a pair of lugs 54 which are integrally formed to the outer end of the swing arm base 17.

Referring particularly to FIGS. 2, 3 and 4, a pair of rectangular openings 29 and 30 are formed transversely through the base 17 of each swing arm 16 and connector blocks 31 and 32 are positioned over the respective openings 29 and 30 and are mounted in place by a set of screws 33. The upper and lower connector blocks 31 and 32 are identical in construction and each provides means for electrically terminating and mechanically securing a set of twelve wires.

Figure 6:
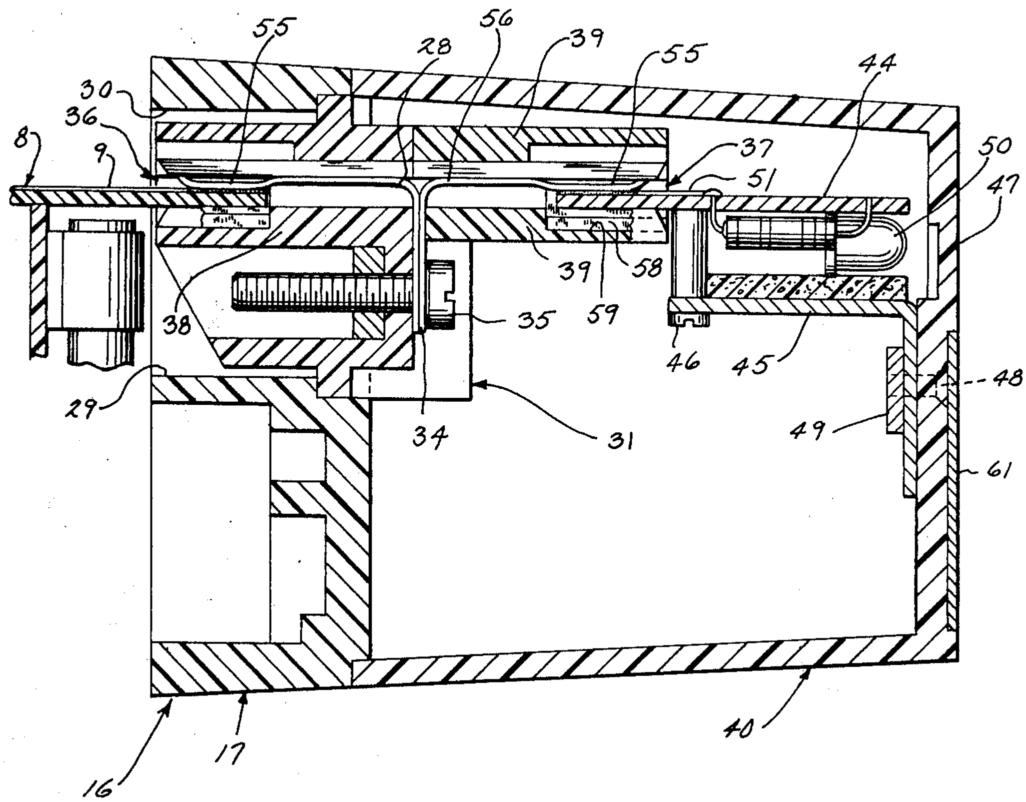
FIG. 6 is a cross section taken through the plane 6—6 in FIG. 4.

Referring particularly to FIGS. 3, 4 and 6, each connector block 31 and 32 includes a set of twelve wire terminals 34 each having a terminal screw 35 that receives and fastens the end of a wire 14. The wire terminals 34 make electrical connection through metal straps 28 with a first set of corresponding stab connectors 36 that extend through the openings 29 and 30 and are directed toward the edge of an associated circuit board 8. The stab connectors 36 include bifurcated metallic fingers 55 which make electrical connection with the terminal pads 9 on the circuit board 8. The wire terminals 34 also make electrical connection through metal straps 56 with a second set of stab connectors 37 that face in the opposite direction from the stab connectors 36. The wire terminals 37 and the first set of stab connectors 36 are supported by a molded plastic base structure 38 and the second set of stab connectors 37 are enclosed in a separate molded plastic support structure 39. The support structure 39 is fastened to the base structure 38 by the screws 33. Each connector block 31 and 32 thus provided termination for a set of wires 14 that extend radially outward from the wire duct 11 and electrically connects those wires to corresponding terminal pads 9 on an associated circuit board 8 when the swing arm 16 is pivoted to its operating position.

Referring particularly to FIGS. 3, 4, 5 and 6, the wires 14 which fasten to the connector blocks 31 and 32 in each swing arm 16 run the length of the swing arm 16 and pass through a wire opening 41 which is formed in the cap portion 20 of the sleeve 18. These wires 14 make a right angle turn within the wire channel 12 and run the length of the wire duct 11 to one of the openings at its ends. The wire opening 41 in each swing arm 16 is aligned with the mouth 13 of the wire duct 11 to allow unobstructed passage of the wires 14 for all positions of the swing arm 16 within its range of motion.

The wires 14 on each swing arm 16 are enclosed by a cover 40 in their run between the swing arm sleeve 18 and connector block wire terminals 34. The cover 40 is substantially rectangular in shape and is molded from a translucent plastic material. The cover 40 is attached by a pair of screws 42 that are received in threaded openings formed in an upper post 43 which extends rearward from the swing arm base 17 and an inset 44 which is formed on the cap portion 20 of the sleeve 18. Although the covers 40 and the cap portions 20 serve to fully enclose the wires 14 in their run between the wire duct 11 and the connector blocks 31 and 32, these can be removed quite easily when the system is wired initially, or when additional wiring is to be made. When all of the swing arm covers 40 and caps 20 are removed, the wire channel 12 is completely accessible through the mouth 13. The wires 14 are fed along the wire duct 11, upward along the selected swing arm 16 and to the selected wire terminals 34 thereon. A label 60 is provided alongside each wire terminal 34 on the swing arm base 17 to place a number or symbol which identifies the source of the wire 14 attached to that terminal, the sleeve cap 20 and cover 40 are then replaced and the equipment is powered up.

In addition to enclosing the upper and lower connector blocks 31 and 32, the cover 40 supports an indicator circuit board 44. The circuit board 44 is fastened to an L-shaped support bracket 45 by a set of screws 46 and the support bracket 45 is in turn fastened to the face 47 of the cover 40 by a set of screws 48 which are received in threaded openings in a fastening bar 49. Each indicator circuit board 44 mounts electrical components including a set of indicator lights 50 which are directed towards the face 47 and which are electrically connected to the upper and lower connector blocks 31 and 32 by a set of terminal pads 51 disposed along the board's forward edge. When the cover 40 is fastened in place over the swing arm 17, the terminal pads 51 are received by the stab connectors 37 on the connector blocks 31 and 32 and the indicator lights 50 thereon are thus electrically connected to selected terminal pads 9 on their associated circuit board 8 when the swing arm 16 is raised to its operating position. The status, or logic states, of the individual circuit on the circuit boards 8 are thus visually indicated through the translucent faces 47 of the covers 40. A label 61 is provided on each cover face 47 to place a number of symbol which identifies the circuit to which each indicator light 50 relates.

With reference particularly to FIG. 1, it should be apparent that when one of the swing arms 16 is lowered to its maintenance position, the associated circuit board 8 is exposed for inspection or it may be removed from the frame 1 for repair or replacement by pulling it rearward and freeing it from the guide rails 6 and 7. When the circuit board 8 has been inspected or replaced its associated swing arm 16 is pivoted upward to the vertical operating position and electrical connection is thus quickly reestablished between selected wires 14 in the wire duct 11 and the terminal pads 9 on the circuit board 8. Electrical connection is simultaneously made between the terminal pads 9 on the circuit board 8 and the indicator lights 50. The wire terminals 34 are completely enclosed by the covers 40, thus substantially reducing the chance of shock if one of the circuit boards 8 is to be examined or replaced without powering down the remainder of the system.

Because each swing arm 16 is mechanically restrained to connect only with a circuit board positioned within its swing plane, a unique keying system is provided by the present invention for insuring that the proper circuit board 8 is inserted in each slot in the frame 1. Referring to FIGS. 3, 4 and 6, the keying system includes plastic plugs 58 which are inserted at selected points along the connector blocks 31 and 32 and mating slots 59 which are formed along the back edge of the proper associated circuit board 8. The plugs 58 prevent the swing arm 16 from moving to its full operating position when a circuit board 8 which has nonmating slots 59 is inserted in the frame 1. Electrical connection to the terminal pads 9 is thus prevented. Similarly, plugs 58 are selectively placed along the connector blocks 31 and 32 to prevent insertion of an incorrect indicator circuit board 44 in the stab connectors 37. The circuit board 8, swing arm 16 and associated cover 40 are thus uniquely keyed to insure proper assembly.

We claim:

1. In an electrical connector for removably connecting a plurality of wires to a set of terminals which are supported by a frame and are positioned within a back plane, the combination comprising:

a wire duct mounted to said frame and having a substantially circular cylindrical shape;

a swing arm having a sleeve formed at one end which wraps around the circumference of said wire duct to rotatably fasten the swing arm thereto for pivotal motion about a pivot axis which is disposed along said wire duct, said pivotal motion being in a plane which is substantially perpendicular to said back plane between an operating position and a maintenance position and which intersects with said set of terminals; and connector means mounted on said swing arm to engage and make electrical connection with said set of terminals when said swing arm is swung into said operating position, said connector means including wire terminal means for making electrical connection with a set of wires.

2. The electrical connector as recited in claim 1 in which said set of terminals are disposed along one edge of a circuit board which is mounted to said frame with said one edge disposed in said back plane and in the plane of said swing arm.

3. The electrical connector as recited in claim 2 in which there are a plurality of circuit boards mounted to said frame each with a set of terminals disposed along one of its edges and located within said back plane, and there are a plurality of swing arms, one associated with each of said circuit boards and rotatably fastened to pivot about said pivot axis in a plane substantially perpendicular to said back plane and substantially in the plane of its associated circuit board, and there are a plurality of connector means, one mounted on each of said swing arms to provide electrical connection of wires with the terminals on its associated circuit board.

4. The electrical connector as recited in claim 3 in which mating keying means are formed on each swing arm and its associated circuit board, and said keying means prevents the swing arm from being swung into electrical connection with the terminals on a circuit board which does not have mating keying means.

5. The electrical connector as recited in claim 1 in which said sleeve wraps substantially all the way around said wire duct and a wire opening is formed in said sleeve and is aligned with a mouth which is formed over a portion of the circumference of said wire duct and through which said set of wires which connect to said connector extend to enter a wire channel which is defined by said wire duct.

6. The electrical connector as recited in claim 5 which includes a cover that fastens to said swing arm and which fully encloses said set of wires in their run from said wire opening to said connector means.

7. The electrical connector as recited in claim 1 in which a cover is fastened to said swing arm to fully enclose said set of wires in their run from the interior of said wire duct to said connector means.

8. The electrical connector as recited in claim 7 in which status indicator lights are mounted to said cover and are electrically connected to said connector means.

9. The electrical connector as recited in claim 8 in which a first label is mounted to said base alongside said wire terminals and a second label is mounted to the outer surface of said cover alongside indicator lights.

10. The electrical connector as recited in claim 8 in which keying means are formed on both said swing arm and said cover, and said keying means is operable to prevent the electrical connection of the status indicator lights on said cover to said connector means when the keying means do not mate.

11. An electrical connector for removably fastening a plurality of wires to circuit board terminals which are disposed along one edge of a circuit board that is mounted to a frame, the combination comprising:

a wire duct mounted to said frame and defining a wire channel which runs the length of the wire duct and which receives wires through an opening at one of its two ends, said wire duct having a mouth intermediate its ends which communicates with said wire channel; and a swing arm having a base which mounts a connector block and having a sleeve formed at one end of said base which surrounds the wire duct at a point intermediate its ends and rotatably mounts the swing arm thereto, said sleeve having a wire opening which communicates with the wire channel through said wire duct mouth and through which wires in said wire channel run to make connection with said connector block;

wherein said swing arm is manually movable about said wire duct between a non-obstructing maintenance position in which said one edge of the circuit board is exposed and an operating position in which the connector block carried by the swing arm engages said circuit board terminals and makes electrical connection between said circuit board terminals and the wires connected to said connector block.

12. The electrical connector as recited in claim 11 in which there are a plurality of circuit boards mounted to said frame and a corresponding number of associated swing arms rotatably mounted to said wire duct to make electrical connection with the terminals on said circuit boards when rotated to their operating position.

13. An electrical connector for removably connecting a plurality of wires to a set of terminals which are disposed along one edge of a printed circuit board which is mounted to a supporting frame, the combination comprising:

an elongated base member having means formed at one of its ends for rotatably mounting said base member to said frame for pivotal motion between an operating position in which it is disposed immediately alongside said one edge of said printed circuit board and a maintenance position in which it may be swung to allow access to said one edge of said printed circuit board;

a connector block mounted on said base member and including a set of wire terminals, a corresponding first set of associated stab connectors, and a second set of stab connectors, said first and second sets of stab connectors being disposed in a line which extends along the lengthwise dimension of the base member, said first set being aligned to engage said one edge of said printed circuit board to make electrical contact with respective ones of said terminals thereon when said base member is disposed in its operating position, said second set being oriented in a direction substantially opposite said first set of stab connectors;

a cover attached to said base and disposed over said connector block to substantially enclose said set of wire terminals; and a second printed circuit board mounted to said cover and substantially enclosed thereby, wherein said second set of stab connectors engage said second printed circuit board when said cover is mounted in place to make electrical contact with respective ones of a set of terminals which are disposed on said second printed circuit board.

14. The electrical connector is recited in claim 13 in which said cover includes translucent portions, and in which a set of indicator lights are mounted to said second printed circuit board.

15. The electrical connector as recited in claim 13 in which keying means are formed on said connector block and associated with said second set of stab connectors and mating keying means are formed on said second printed circuit board, such that said keying means prevents the attachment of a cover which does not mount a printed circuit board having mating keying means.

* * * * *